(12) United States Patent
Li et al.

(10) Patent No.: US 11,955,590 B2
(45) Date of Patent: Apr. 9, 2024

(54) DISPLAY PANEL AND METHOD FOR MAKING THE SAME

(71) Applicant: HKC CORPORATION LIMITED, Shenzhen (CN)

(72) Inventors: Zeyao Li, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/089,597

(22) Filed: Dec. 28, 2022

(65) Prior Publication Data
US 2023/0387368 A1    Nov. 30, 2023

(30) Foreign Application Priority Data

May 24, 2022    (CN) .......................... 202210569500.1

(51) Int. Cl.
*H01L 33/62*    (2010.01)
*H01L 25/075*    (2006.01)
*H01L 33/00*    (2010.01)
*H01L 33/38*    (2010.01)

(52) U.S. Cl.
CPC .......... *H01L 33/62* (2013.01); *H01L 25/0753* (2013.01); *H01L 33/0093* (2020.05); *H01L 33/382* (2013.01); *H01L 2933/0016* (2013.01); *H01L 2933/0066* (2013.01)

(58) Field of Classification Search
CPC . H01L 33/62; H01L 25/0753; H01L 33/0093; H01L 33/382; H01L 2933/0016; H01L 2933/0066; H01L 25/167; H01L 27/1266; H01L 27/124; H01L 27/156
See application file for complete search history.

(56) References Cited

U.S. PATENT DOCUMENTS

| | | | |
|---|---|---|---|
| 6,700,631 B1 * | 3/2004 | Inoue | H01L 27/1266 257/E27.111 |
| 2018/0175268 A1 * | 6/2018 | Moon | H01L 27/15 |
| 2021/0217837 A1 | 7/2021 | Gu et al. | |
| 2021/0408052 A1 * | 12/2021 | Liang | H01L 33/62 |

FOREIGN PATENT DOCUMENTS

| | | |
|---|---|---|
| CN | 110021234 A | 7/2019 |
| CN | 110034150 A | 7/2019 |
| CN | 111430428 A | 7/2020 |

(Continued)

OTHER PUBLICATIONS

Chinese First Office Action, Chinese Application No. 202210569500.1, dated Jul. 4, 2022 (16 pages).

(Continued)

*Primary Examiner* — Su C Kim

(57) ABSTRACT

The present disclosure provides a display panel and a method for making the display panel. The method for making the display panel includes: providing a substrate; preparing a driving circuit layer on one side of the substrate; the driving circuit layer includes a binding layer, a display base and an array circuit layer which are stacked, and the binding layer is located between the display base and the substrate. Removing the substrate and the binding layer is exposed; binding the external control unit on the binding layer.

22 Claims, 12 Drawing Sheets

(56) References Cited

FOREIGN PATENT DOCUMENTS

| CN | 111952331 A | 11/2020 |
| CN | 112366218 A | 2/2021 |
| CN | 112736096 A | 4/2021 |
| CN | 114203734 A | 3/2022 |

OTHER PUBLICATIONS

Chinese second Office Action, Chinese Application No. 202210569500. 1, dated Jul. 27, 2022 (17 pages).
Chinese third Office Action, Chinese Application No. 202210569500. 1, dated Aug. 16, 2022 (10 pages).

* cited by examiner

DISPLAY PANEL AND METHOD FOR MAKING THE SAME

CROSS REFERENCE TO RELATED DISCLOSURES

The present disclosure claims the foreign priority of the Chinese patent disclosure No. 202210569500.1, entitled "DISPLAY PANEL AND METHOD FOR MAKING THE SAME" and filed on May 24, 2022 in the China National Intellectual Property Administration, and the entire contents of which are hereby incorporated by reference in their entireties.

TECHNICAL FIELD

The present disclosure relates to the field of display technology, and in particular, to a display panel and a method for making the same.

BACKGROUND

In the LED display technology, besides the view area (VA) or active area (AA), there must be a binding area for binding the external control unit which is configured to input the external signal into the display. The existence of the binding area is the biggest obstruction to the frameless or borderless technology of LED display, so a method for making borderless display is urgently needed to remove the binding area.

In the method of making a borderless display of the related art, an array circuit layer is arranged on a substrate first, a binding layer is disposed on the back of the substrate, and then a through hole is formed on the substrate, and a conductive material is filled in the through hole to make the binding layer and the array circuit layer being electrically connected. However, since the binding layer is disposed on the back of the substrate, and the conductive material is filled in the through hole after the array circuit layer has been disposed, the above method is easy to cause the array circuit layer to be damaged by the processes such as forming hole or setting the binding layer.

SUMMARY

In view of this, the present disclosure provides a display panel and a method for making the display panel, in order to overcome the problem that the array circuit layer is damaged by forming holes after the array circuit layer is arranged in the prior art.

In order to overcome the aforementioned technical problems, the first aspect is provided by the present disclosure is a method for making a display panel, which includes: providing a substrate; preparing a driving circuit layer on one side of the substrate; the driving circuit layer includes a binding layer, a display base and an array circuit layer which are stacked, and the binding layer is located between the display base and the substrate; removing the substrate to expose the binding layer; binding an external control unit on the binding layer.

Furthermore, before the step of preparing the driving circuit layer on one side of the substrate, includes: forming an sacrifice layer on the surface of the substrate; and the preparing the driving circuit layer on one side of the substrate includes: preparing the driving circuit layer on the side of the sacrifice layer away from the substrate; the removing the substrate includes: the substrate is separated from the driving circuit layer by removing the sacrifice layer.

Furthermore, the preparing the driving circuit layer on the side of the sacrifice layer away from the substrate includes: forming the binding layer on the surface of the sacrifice layer away from the substrate; forming a display base on the substrate; the binding layer is covered by the display base, and the display base is provided with a plurality of first through holes to expose part of the binding layer; arranging the array circuit layer on the side of the display base away from the binding layer; the array circuit layer is electrically connected to the binding layer through a first through hole.

Furthermore, the forming the display base on the substrate includes: arranging a hard substrate or a flexible layer on the substrate; forming the first through hole in the hard substrate or the flexible layer; filling a conductive material in the first through hole; or, the forming the display base on the substrate includes: disposing a hard substrate with the first through hole or a flexible layer with the first through hole on the substrate; filling a conductive material in the first through hole.

Furthermore, the arranging the array circuit layer on the side of the display base away from the binding layer includes: depositing a first metal layer on the surface of the display base away from the substrate; the first metal layer covers the first through hole and in direct contacts with the conductive material in the first through hole; patterning the first metal layer to form a connecting portion electrically connected to the binding layer.

Furthermore, the forming a display base on the substrate includes: depositing an insulating layer on the substrate; forming the first through hole in the insulating layer; the arranging the array circuit layer on the side of the display base away from the binding layer includes: depositing a first metal layer on the surface of the insulating layer away from the substrate; the first metal layer is partially arranged in the first through hole and electrically connected to the binding layer; patterning the first metal layer to form a connecting portion electrically connected to the binding layer.

Furthermore, the arranging the array circuit layer on the side of the display base away from the binding layer further includes: forming a semiconductor layer on the side of the display base away from the binding layer; doping the semiconductor layer to form a channel, a source and a drain; forming a dielectric layer on the side of the connecting portion away from the binding layer; the dielectric layer covers the semiconductor layer and the connecting portion; depositing a second metal layer on the side of the dielectric layer away from the binding layer; patterning the second metal layer to form a gate electrode and a scanning line; the scanning line is electrically connected to the connecting portion; depositing a planarization layer on the side of the second metal layer away from the binding layer; depositing a third metal layer on the side of the planarization layer away from the binding layer; patterning the third metal layer to form a data line, a first electrode and a second electrode; the data line is electrically connected to the source, the first electrode is electrically connected to the drain, and the data line and the second electrode are electrically connected to the binding layer through different of the connecting portion.

Furthermore, the method for making the display panel further includes: disposing a plurality of light emitting units on one side of the array circuit layer away from the substrate; the light emitting unit is electrically connected to the array circuit layer; disposing a cover substrate on one side of the plurality of light emitting units away from the substrate; the removing the substrate to expose the binding layer includes: keeping the plurality of the light emitting units, the driving circuit layer, the insulating layer and the binding layer are arranged on the cover substrate in that order.

In order to overcome the aforementioned technical problems, a third aspect is provided in the present disclosure is a display panel, which includes a substrate and a driving circuit layer, the driving circuit layer is disposed on one side of the substrate; the driving circuit layer includes a binding layer, a display base and an array circuit layer which are stacked, and the binding layer is located between the display base and the substrate; the display base is provided with a plurality of first through holes, and a conductive material is filled in the plurality of first through holes; and the binding layer covers the conductive material and in direct contacts with the conductive material.

BRIEF DESCRIPTION OF THE DRAWINGS

In order to more clearly illustrate the technical solutions of the embodiments of the present disclosure, the drawings for the description of the embodiment will be described in brief. Obviously, the drawings in the following description are only some of the embodiments of the present disclosure. For a person of ordinary skill in the art, other drawings may be obtained based on the following drawings without any creative work.

DETAILED DESCRIPTION

Technical solutions of the embodiments of the present disclosure will be clearly and comprehensively described by referring to the accompanying drawings. Obviously, the embodiments described herein are only a part of, but not all of, the embodiments of the present disclosure. Based on the embodiments in the present disclosure, all other embodiments obtained by a person of ordinary skill in the art without any creative work shall fall within the scope of the present disclosure.

In addition, when using expressions "first", "second", and the like in the embodiment of the present disclosure, the expressions "first", "second", and the like are used for descriptive purposes only, and shall not be interpreted as indicating or implying relative importance or implicitly specifying the number of an indicated technical feature. Therefore, features defined by "first" and "second" may explicitly or implicitly include at least one of the such feature. In addition, technical solutions of various embodiments may be combined with each other, but only on the basis that the technical solutions may be achieved by a person of ordinary skill in the art. When combination of technical solutions appears to be contradictory or unachievable, such combination of technical solutions shall be interpreted as inexistence and excluded from the scope of the present disclosure.

The reference to "an embodiment" means that a specific feature, structure or characteristic described in connection with an embodiment may be included in at least one embodiment of present disclosure. The appearance of "an embodiment" in various places in the specification does not necessarily refer to the same embodiment, nor is it an independent or alternative embodiment mutually exclusive with other embodiments. It is understood explicitly and implicitly by those skilled in the art that the embodiments described in the present disclosure can be combined with other embodiments.

Figure 1:
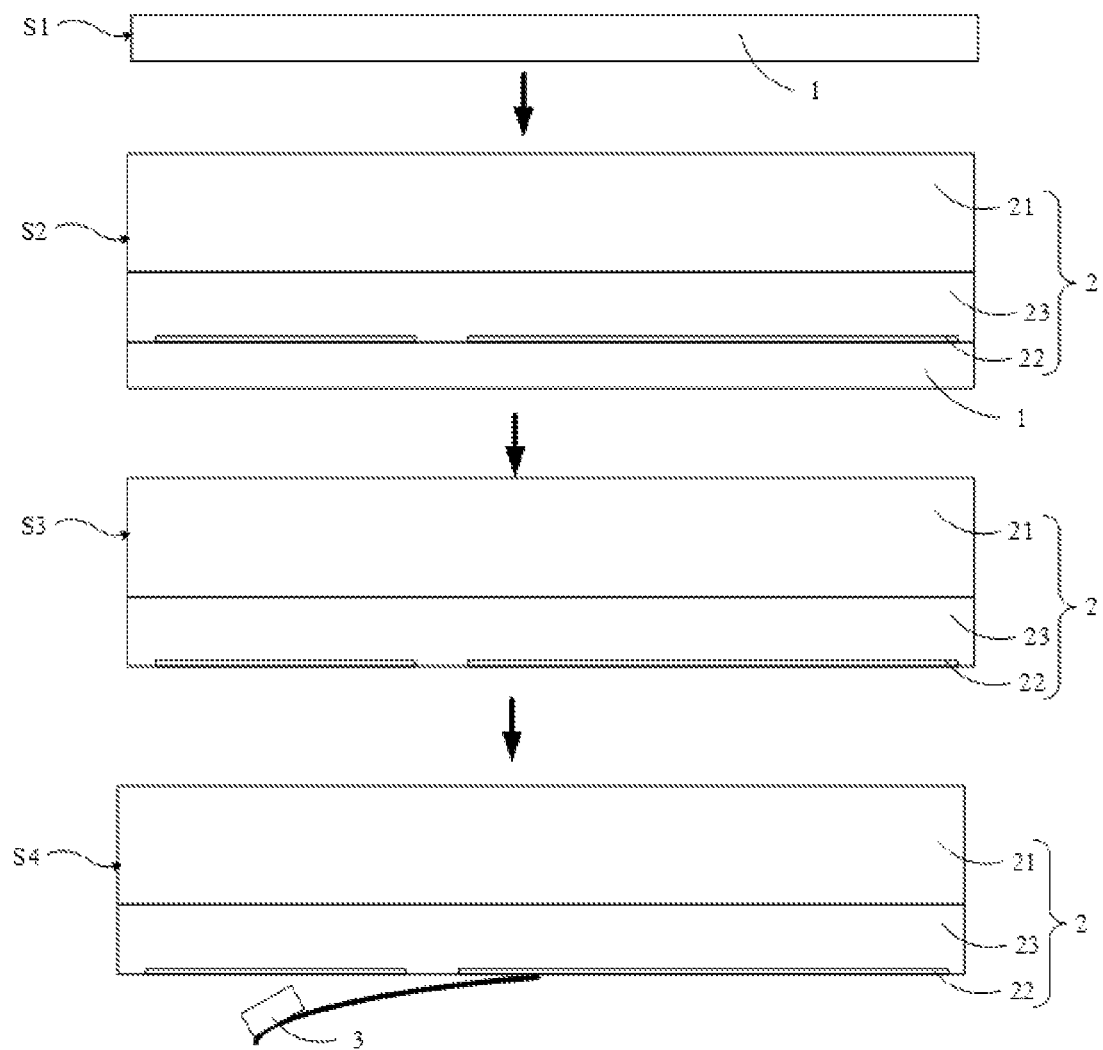
FIG. 1 is a process flow diagram of a method for making a display panel provided in a first embodiment of the present disclosure.
Figure 2:
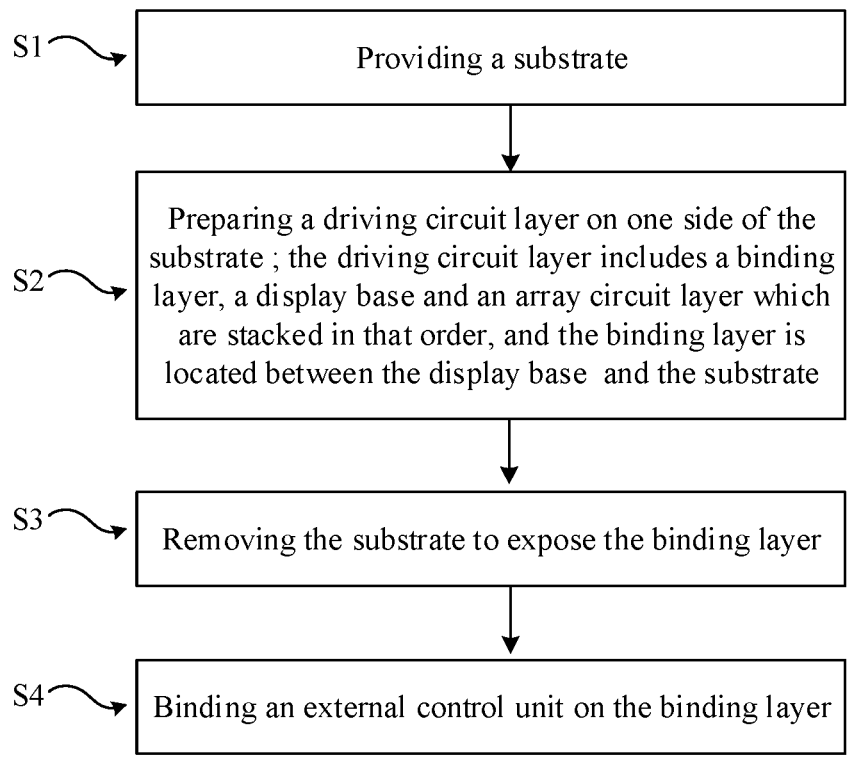
FIG. 2 is a block flow diagram of a method for making the display panel provided in the first embodiment of the present disclosure.

Referring to FIG. 1 to FIG. 2. FIG. 1 is a process flow diagram of a method for making a display panel provided in a first embodiment of the present disclosure; FIG. 2 is a block flow diagram of a method for making the display panel provided in the first embodiment of the present disclosure.

A method for making a display panel 100 provided in an embodiment includes:

S1: Providing a substrate 1.

In one embodiment, the substrate 1 is used as a temporary base of the display panel 100 for making a driving circuit layer 2, and the substrate 1 can be glass plate or other hard substrates.

S2: preparing a driving circuit layer 2 on one side of the substrate 1; the driving circuit layer 2 includes a binding layer 22, a display base 23 and an array circuit layer 21 which are stacked in that order, and the binding layer 22 is located between the display base 23 and the substrate 1.

In one embodiment, the driving circuit layer 2 is prepared on one surface of the substrate 1. The driving circuit layer 2 may include but not limited to the binding layer 22, the display base 23, and the array circuit layer 21. The binding layer 22 is configured to bind an external control unit 3, such as a chip, etc. The binding layer 22 forms a metal circuit layer and is disposed between the display base 23 and the substrate 1. The array circuit layer 21 is located on the side of the substrate 1 away from the binding layer 22, and the array circuit layer 21 is electrically connected to the binding layer 22. The array circuit layer 21 can be electrically connected to the light emitting units 4 of the display panel 100, and provides power supply for the light emitting units 4 to emit light.

S3, removing the substrate 1 to expose the binding layer 22.

In one embodiment, after the driver circuit layer 2 is formed, the substrate 1, which is temporarily disposed, is removed, so that the binding layer 22 arranged on one side of the substrate 1 is exposed, so that it is convenient to bind other control units on the binding layer 22. The method of removing the substrate 1 is not limited, and the driving circuit layer 2 can be separated from the substrate 1 by mechanical stripping.

S4: binding an external control unit 3 on the binding layer 22.

In one embodiment, other control units, such as IC chips or other control units, can be directly bound on the exposed binding layer 22.

In one embodiment, the driving circuit layer 2 is disposed on the substrate 1, thus the array circuit layer 21 can be electrically connect to the binding layer 22 of the driving circuit layer 2, and after setting the driving circuit layer 2, the substrate 1 is removed, so that the external control unit 3 can be bind on the substrate 1 directly. Thereby the array circuit layer 21 is prevented from being damaged by a forming process of the hole or the setting process of the binding layer 22.

Figure 3:
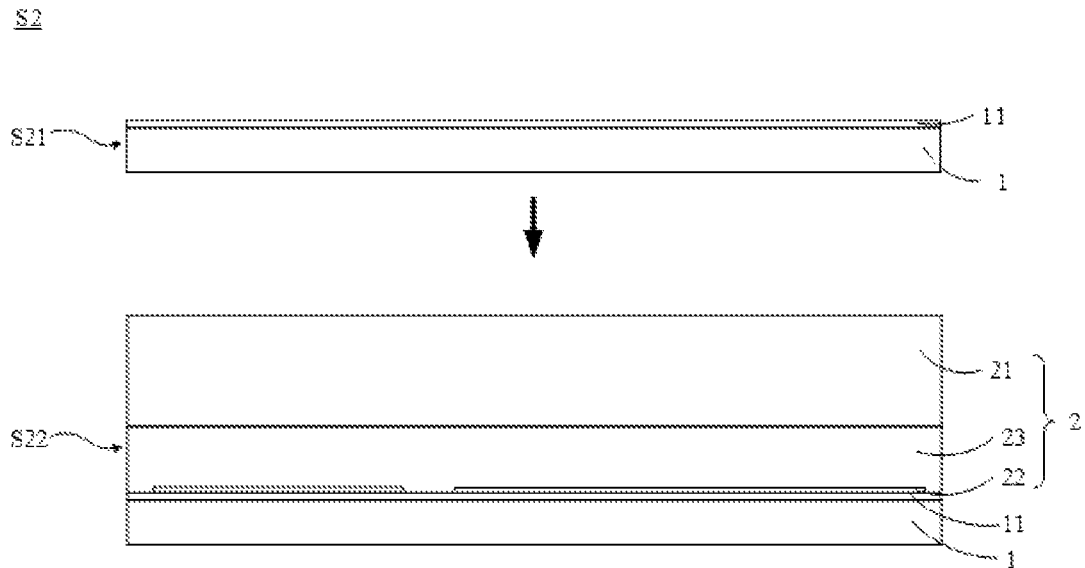
FIG. 3 is a process flow diagram of setting an sacrifice layer before the preparing a driving circuit layer on one side of a substrate in a second embodiment of the present disclosure.
Figure 4:
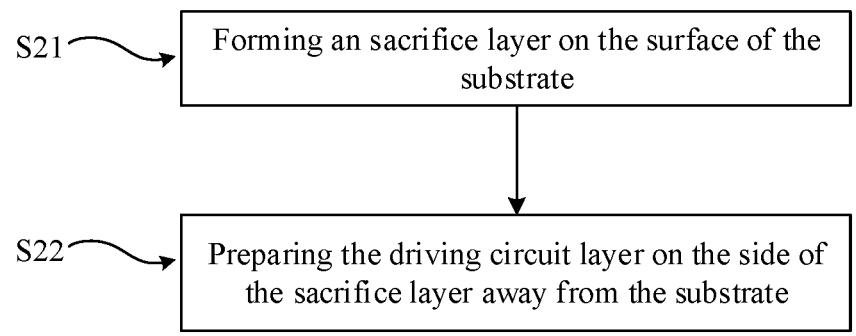
FIG. 4 is a block flow diagram of setting an sacrifice layer before the preparing a driving circuit layer on one side of a substrate in the second embodiment of the present disclosure.

Referring to FIG. 3 to FIG. 4. FIG. 3 is a process flow diagram of setting an sacrifice layer before the step of preparing a driving circuit layer on one side of a substrate in a second embodiment of the present disclosure. FIG. 4 is a block flow diagram of setting an sacrifice layer before the step of preparing a driving circuit layer on one side of a substrate in the second embodiment of the present disclosure.

In a second embodiment, before the step S2 of preparing the driving circuit layer 2 on one side of the substrate 1 further includes:

S21: forming an sacrifice layer 11 on the surface of the substrate 1.

In one embodiment, the sacrifice layer 11 can make the stripping of the substrate 1 from the binding layer 22 more easily. The sacrifice layer 11 can be made of soft materials that can be decomposed by laser or chemically etched, such as polystyrene, epoxy resin, acrylate, etc., or other materials, which are not limited in present disclosure.

S22: preparing the driving circuit layer 2 on the side of the sacrifice layer 11 away from the substrate 1.

In one embodiment, the binding layer 22, the display base 23 and the array circuit layer 21 are prepared on the surface of the sacrifice layer 11 away from the substrate 1 in that order. The functions of the binding layer 22, the display base 23 and the array circuit layer 21 can refer to the aforementioned contents, which will not be described here.

Furthermore, the step S3 of removing the substrate 1 includes:

The substrate 1 is separated from the driving circuit layer 2 by removing the sacrifice layer 11.

In one embodiment, since the sacrifice layer 11 is disposed between the driving circuit layer 2 and the substrate 1, the substrate 1 can be separated from the driving circuit layer 2 after the sacrifice layer 11 is removed. The method of removing the sacrifice layer 11 may be laser irradiation, to decompose the sacrifice layer 11, so that the sacrifice layer 11 is removed. Alternatively, the sacrifice layer 11 may be removed by chemical etching so that the substrate 1 is separated from the driving circuit layer 2. By arranging the sacrifice layer 11, the driving circuit layer 2 is arranged on the sacrifice layer 11, and the driving circuit layer 2 can be separated from the substrate 1 by removing the sacrifice layer 11. So that the efficiency of removing the substrate 1 can be higher, and the driving circuit layer 2 has less chance to be damaged.

Figure 5:
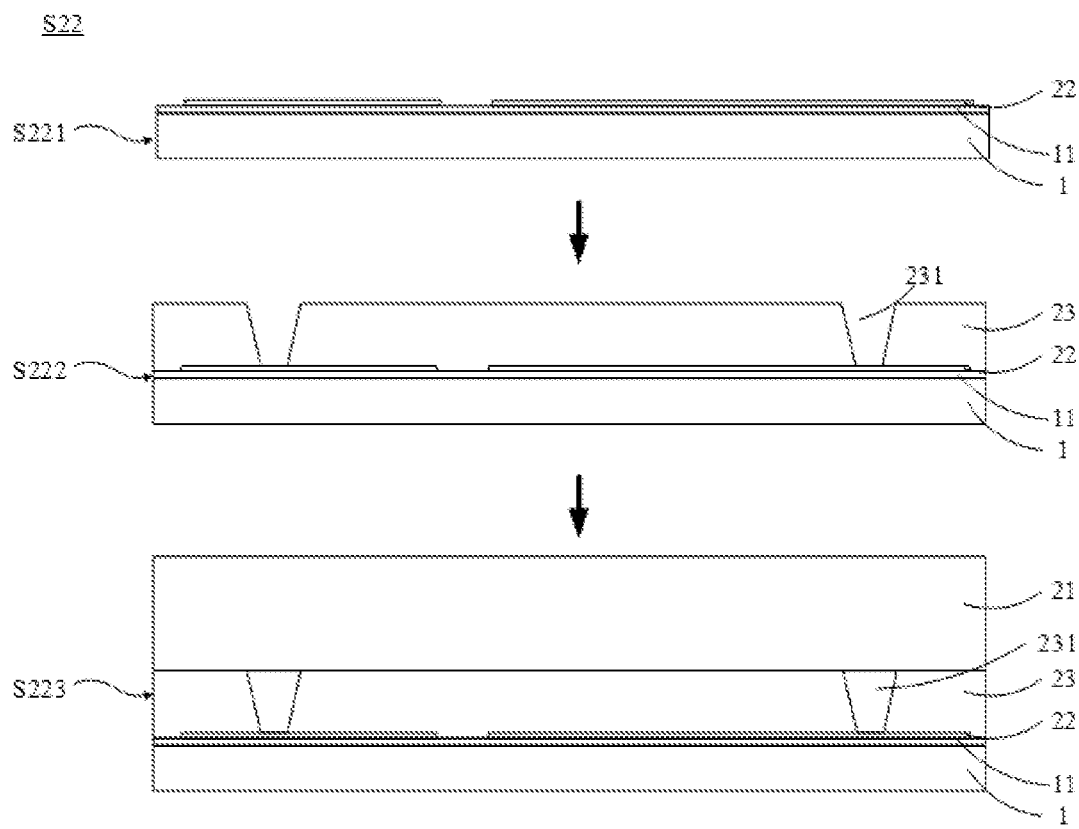
FIG. 5 is a process flow diagram of preparing a driving circuit layer on the side of the sacrifice layer away from the substrate in the second embodiment of present disclosure.
Figure 6:
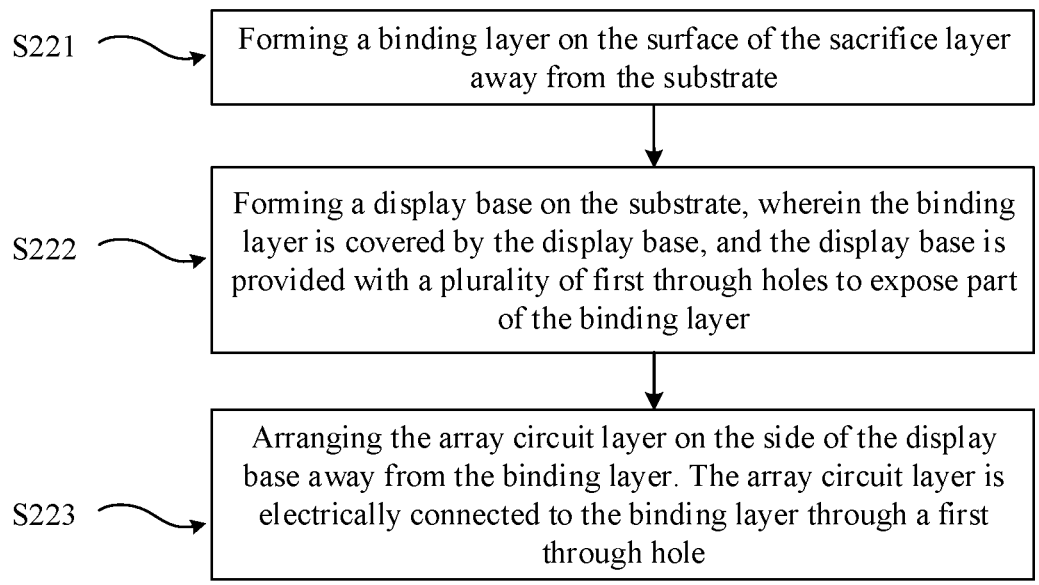
FIG. 6 is a block flow diagram of preparing a driving circuit layer on the side of the sacrifice layer away from the substrate in the second embodiment of the present disclosure.

Referring to FIG. 5 to FIG. 6. FIG. 5 is a process flow diagram of preparing a driving circuit layer on the side of the sacrifice layer away from the substrate in the second embodiment of present disclosure. FIG. 6 is a block flow diagram of preparing a driving circuit layer on the side of the sacrifice layer away from the substrate in the second embodiment of the present disclosure.

In the second embodiment, the step S22 of preparing the driving circuit layer 2 on the side of the sacrifice layer 11 away from the substrate 1 includes:

S221: forming a binding layer 22 on the surface of the sacrifice layer 11 away from the substrate 1.

S222: forming a display base 23 on the substrate 1, wherein the binding layer 22 is covered by the display base 23, and the display base 23 is provided with a plurality of first through holes 231 to expose part of the binding layer 22.

S223: arranging the array circuit layer 21 on the side of the display base 23 away from the binding layer 22. The array circuit layer 21 is electrically connected to the binding layer 22 through a first through hole 231.

In one embodiment, the binding layer 22 is disposed on a part of the surface of the sacrifice layer 11 away from the substrate 1, and the binding layer 22 is completely covered by the display base 23. A plurality of first through holes 231 are formed in the display base 23, so that the part of the binding layer 22 corresponding to the first through holes 231 can be exposed. An array circuit layer 21 is disposed on a surface of the display base 23 away from the binding layer 22, and the array circuit layer 21 can be electrically connected to the exposed part of the binding layer 22, through the conductive material 232 filled in the first through hole 231.

Forming the first through hole 231 in the display base 23 and filling the conductive material 232 in the first through hole 231, the binding layers 22 is arranged on the side of the display base 23 opposite to the array circuit layer 21, and the binding layers 22 is electrically connected to the array circuit layer 21. Compared with the method of arranging the array circuit layer 21 firstly, and then forming holes to connect the array circuit layer 21 and the binding layer 22, the method of the present disclosure can avoid the damage of the forming process to the array circuit layer 21, and ensure the electrical connection effect between the binding layer 22 and the array circuit layer 21 is improved.

Figure 7:
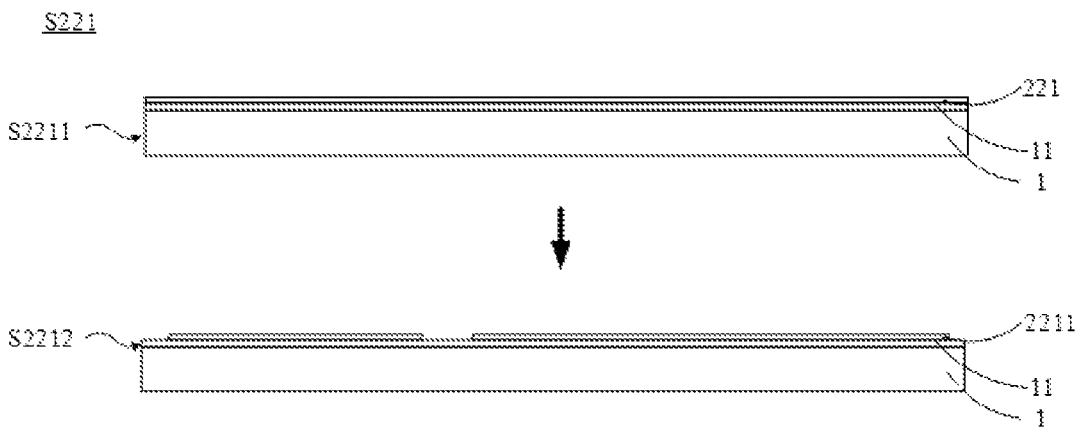
FIG. 7 is a process flow diagram of preparing a binding layer on the surface of the sacrifice layer away from the substrate in the second embodiment of the present disclosure.
Figure 8:
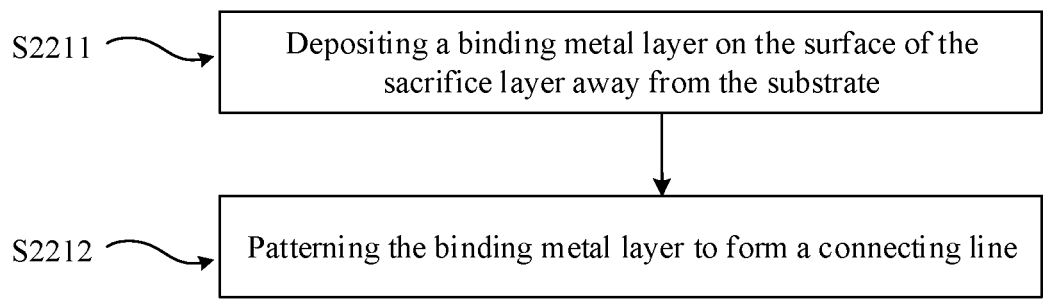
FIG. 8 is a block flow diagram of preparing a binding layer on the surface of the sacrifice layer away from the substrate in the second embodiment of the present disclosure.

Referring to FIG. 7 to FIG. 8. FIG. 7 is a process flow diagram of preparing a binding layer on the surface of the sacrifice layer away from the substrate in the second embodiment of the present disclosure. FIG. 8 is a block flow diagram of preparing a binding layer on the surface of the sacrifice layer away from the substrate in the second embodiment of the present disclosure.

The step S221 of forming the binding layer 22 on the surface of the sacrifice layer 11 away from the substrate 1 includes:
S2211: depositing a binding metal layer 221 on the surface of the sacrifice layer 11 away from the substrate 1.
S2212: patterning the binding metal layer 221 to form a connecting line 2211.

In one embodiment, the binding metal layer 221 can be a whole metal layer, and the binding metal layer 221 is patterned by photolithography and other processes, so as to form the connecting line 2211. The connecting line 2211 forms the binding layer 22.

Figure 9:
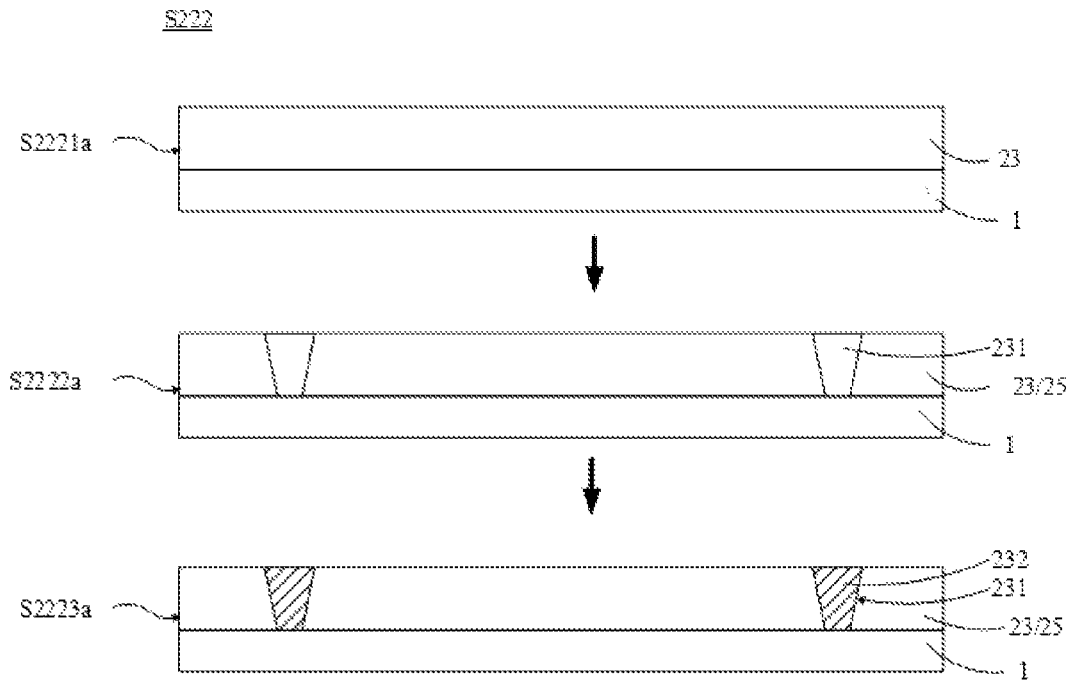
FIG. 9 is a process flow diagram of a first method of forming a display base on a substrate in a third embodiment of the present disclosure.
Figure 10:
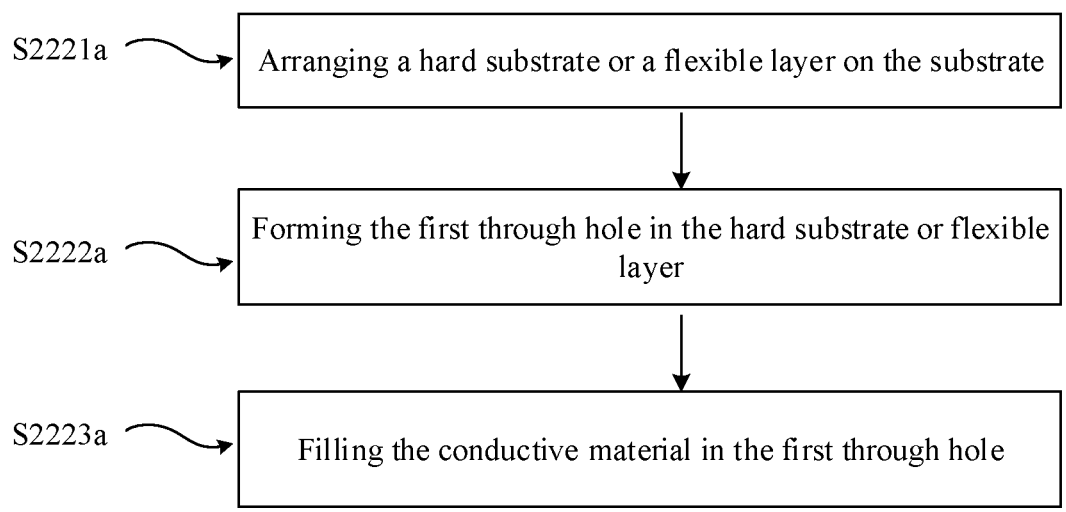
FIG. 10 is a block flow diagram of the first method of forming a display base on a substrate in the third embodiment of the present disclosure.

Referring to FIG. 9 to FIG. 10, FIG. 9 is a process flow diagram of a first method of forming a display base on a substrate in a third embodiment of the present disclosure. FIG. 10 is a block flow diagram of the first method of forming a display base on a substrate in the third embodiment of the present disclosure.

In the first method of the embodiment, the step S222 of forming the display base 23 on the substrate 1 includes:
S2221a: arranging a hard substrate or a flexible layer 25 on the substrate 1.
S2222a: forming the first through hole 231 in the hard substrate or flexible layer 25.
S2223a: filling the conductive material 232 in the first through hole 231.

In one embodiment, the hard substrate can be a silicon, a glass or a ceramic, and the flexible layer can be made of polymer flexible materials such as PI (Polyimide). In one embodiment, since the display base 23 can be supported by the substrate 1, so that adopting the flexible layer as the display base 23 can be more convenient. Namely, in one embodiment, the hard substrate or the flexible layer 25 can be disposed on the substrate 1, and then the hole can be formed. The hole forming method can be laser etching or mechanical hole forming, which is not limited in present disclosure. After the hole forming, the conductive material 232 is filled in the first through hole 231, so that the binding layer 22 can be connected to the array circuit layer 21 by the conductive material 232.

Figure 11:
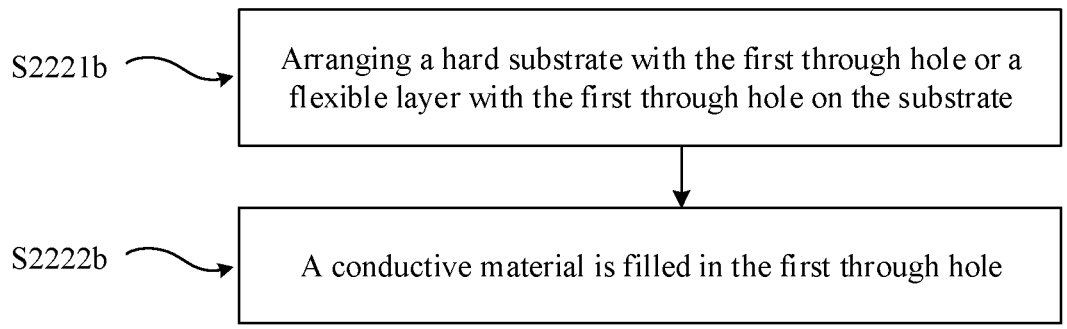
FIG. 11 is a block flow diagram of a second method of forming a display base on a substrate in the third embodiment of the present disclosure.

Referring to FIG. 11, FIG. 11 is a block flow diagram of a second method of forming a display base on a substrate in the third embodiment of the present disclosure.

In a second method of the embodiment, the step S222 of forming the display base 23 on the substrate 1 includes:
S2221b: arranging a hard substrate with the first through hole 231 or a flexible layer with the first through hole 231 on the substrate 1;
S2222b: a conductive material 232 is filled in the first through hole 231.

In one embodiment, in one embodiment, the first through hole 231 in the hard substrate or flexible layer 25 can be formed in advance, so that the process can be simplified, and the making efficiency can be improved. The method of forming the first through hole 231 and filling the conductive material 232 in the first through hole 231 is the same as the above, so it will not be repeated here.

The hard substrate or flexible layer 25 is a free-standing structure, and the light-emitting units 4, the driving circuit layer 2 and the binding layer 22 can be supported by the hard substrate or flexible layer 25. In addition, the hard substrate or flexible layer 25 has a certain thickness, such as 50 μm to 100 μm, so as to the hard substrate or flexible layer 25 has support function and can support the structures above mentioned.

Figure 12:
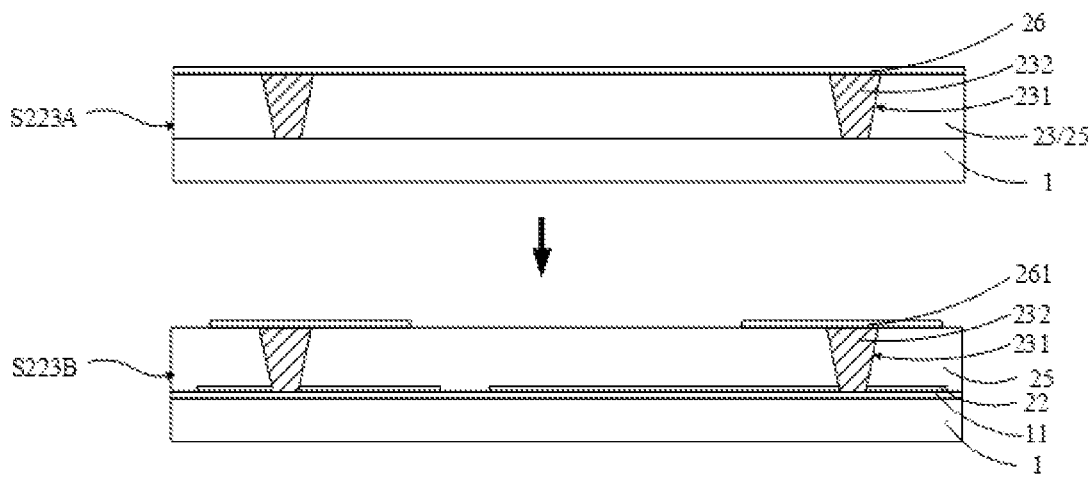
FIG. 12 is a process flow diagram showing some steps of setting an array circuit layer on the side of the substrate away from the binding layer in the third embodiment of the present disclosure.
Figure 13:
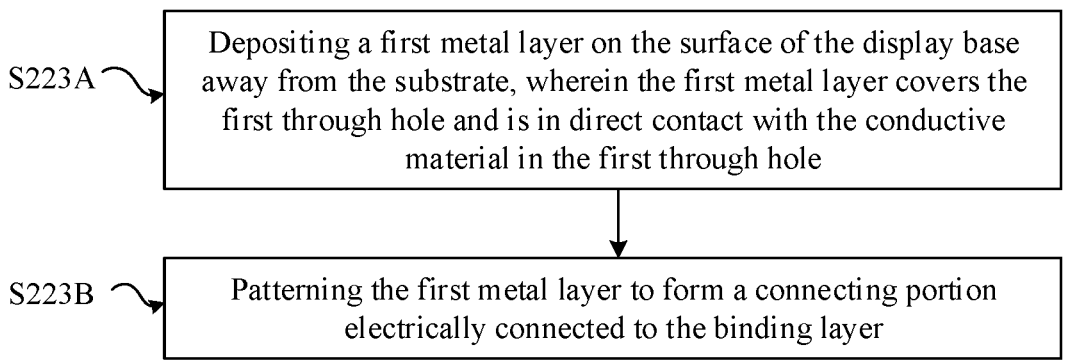
FIG. 13 is a block flow diagram showing some steps of setting an array circuit layer on the side of the substrate away from the binding layer in the third embodiment of the present disclosure.

Referring to FIG. 12 to FIG. 13. FIG. 12 is a process flow diagram showing some steps of setting an array circuit layer on the side of the substrate away from the binding layer in the third embodiment of the present disclosure. FIG. 13 is a block flow diagram showing some steps of setting an array circuit layer on the side of the substrate away from the binding layer in the third embodiment of the present disclosure.

In a third embodiment, the step S223 of arranging the array circuit layer 21 on the side of the display base 23 away from the binding layer 22 includes:
S223A: depositing a first metal layer 26 on the surface of the display base 23 away from the substrate 1, wherein the first metal layer 26 covers the first through hole 231 and is in direct contact with the conductive material 232 in the first through hole 231.
S223B: patterning the first metal layer 26 to form a connecting portion 261 electrically connected to the binding layer 22.

In one embodiment, the first metal layer 26 is deposited on the surface of the display base 23 away from the substrate 1 by chemical vapor deposition or magnetron sputtering. The first metal layer 26 covers the first through hole 231 directly during the deposition process, and the first metal layer 26 can be direct contact with the conductive material 232 filled in the first through hole 231, so as to the electrical connection between the first metal layer 26 and the binding layer 22 can be realized. By patterning the first metal layer 26, the connecting portion 261 electrically connected to the binding layer 22 can be formed. The number of the connecting portion 261 can be selected according to need, which is not limited in present disclosure.

Figure 14:
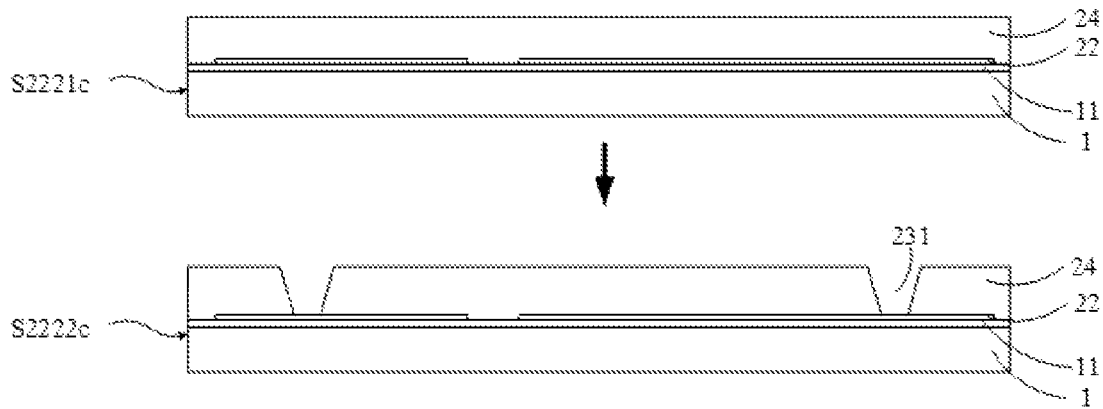
FIG. 14 is a process flow diagram of a third method of forming a display base on a substrate in the third embodiment of the present disclosure.
Figure 15:
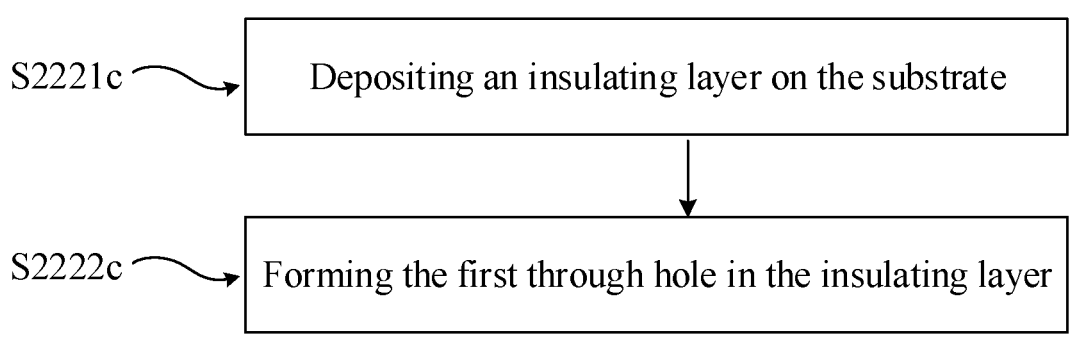
FIG. 15 is a block flow diagram of the third method of forming a display base on a substrate in the third embodiment of the present disclosure.

Please refer to FIGS. 14 to 15, FIG. 14 is a process flow diagram of a third method of forming a display base on a substrate in the third embodiment of the present disclosure. FIG. 15 is a block flow diagram of the third method of forming a display base on a substrate in the third embodiment of the present disclosure.

In a third method of the embodiment, the step S222 of forming the display base 23 on the substrate 1 includes:

S2221c: depositing an insulating layer 24 on the substrate 1.

S2222c: forming the first through hole 231 in the insulating layer 24.

In one embodiment, the insulating layer 24 is deposited by a thick film process, so the thickness of the insulating layer 24 can be smaller than the hard substrate or the flexible layer 25, such as a thickness of the insulating layer 24 is not more than 25 μm, for example in the range of 5 μm to 20 μm, thus the overall thickness of the display panel 100 is reduced compared with the prior art which using the free-standing substrate with a thickness above 50 μm. The insulating layer 24 may be oxide or nitride, such as silicon oxide or aluminum oxide. The insulating layer 24 defines the first through hole 231, so that the conductive material 232 or a conducting layer can be filled in the first through hole 231. The insulating layer 24 can also be a polymer, such as PI.

Figure 16:
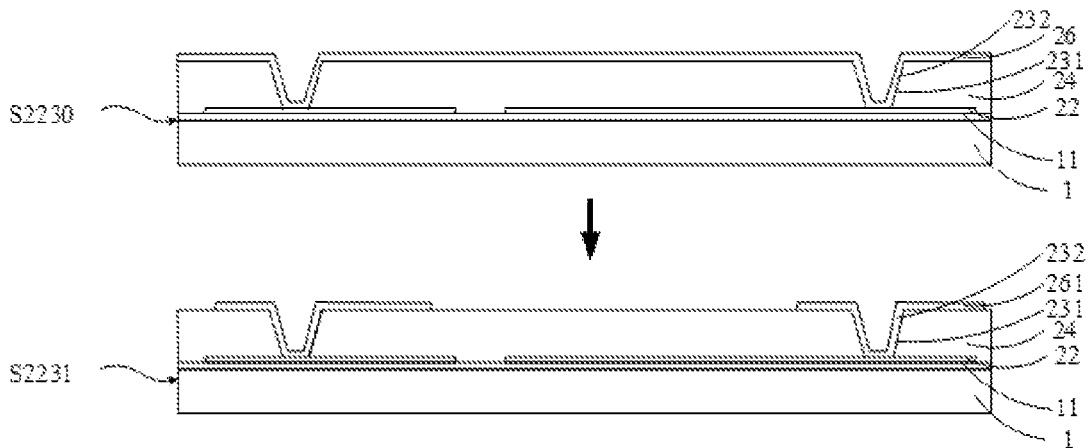
FIG. 16 is a process flow diagram showing some steps of setting an array circuit layer on the side of the substrate away from the binding layer in a fourth embodiment of the present disclosure.
Figure 17:
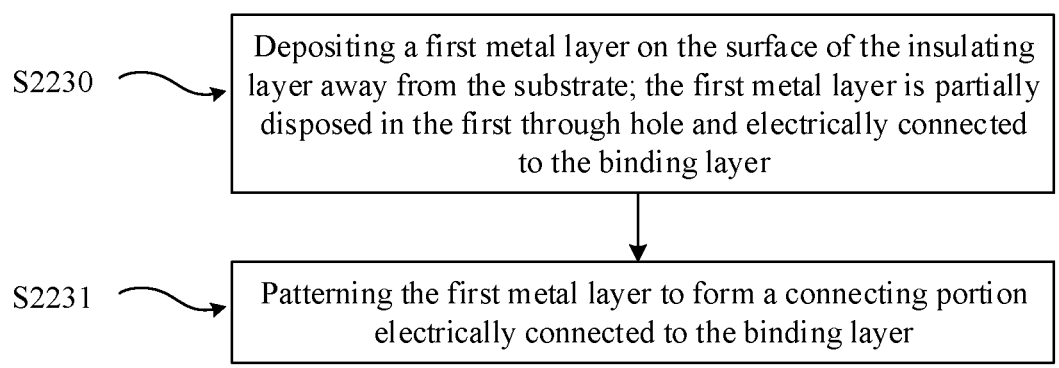
FIG. 17 is a block flow diagram showing some steps of setting an array circuit layer on the side of the substrate away from the binding layer in the fourth embodiment of the present disclosure.

Referring to FIG. 16 to FIG. 17, FIG. 16 is a process flow diagram showing some steps of setting an array circuit layer on the side of the substrate away from the binding layer in a fourth embodiment of the present disclosure. FIG. 17 is a block flow diagram showing some steps of setting an array circuit layer on the side of the substrate away from the binding layer in the fourth embodiment of the present disclosure.

In a fourth embodiment, the step S223 of arranging the array circuit layer 21 on the side of the display base 23 away from the binding layer 22 includes:

S2230: depositing a first metal layer 26 on the surface of the insulating layer 24 away from the substrate 1; the first metal layer 26 is partially disposed in the first through hole 231 and electrically connected to the binding layer 22;

S2231: patterning the first metal layer 26 to form a connecting portion 261 electrically connected to the binding layer 22.

In one embodiment, since the thickness of the insulating layer 24 is small, the first metal layer 26 is deposited on the surface of the insulating layer 24 with the first through hole 231, and the first metal layer 26 can be partially disposed in the first through hole 231 during the deposition process. So that the first metal layer 26 can be electrically connected to the binding layer 22 directly, and the first metal layer 26 is patterned to form the connecting portion 261 electrically connected to the binding layer 22 directly. In one embodiment, there is no need to fill the conductive material 232 in the first through hole 231, which can simplify the process and save materials, thus the making efficiency is improved.

Figure 18:
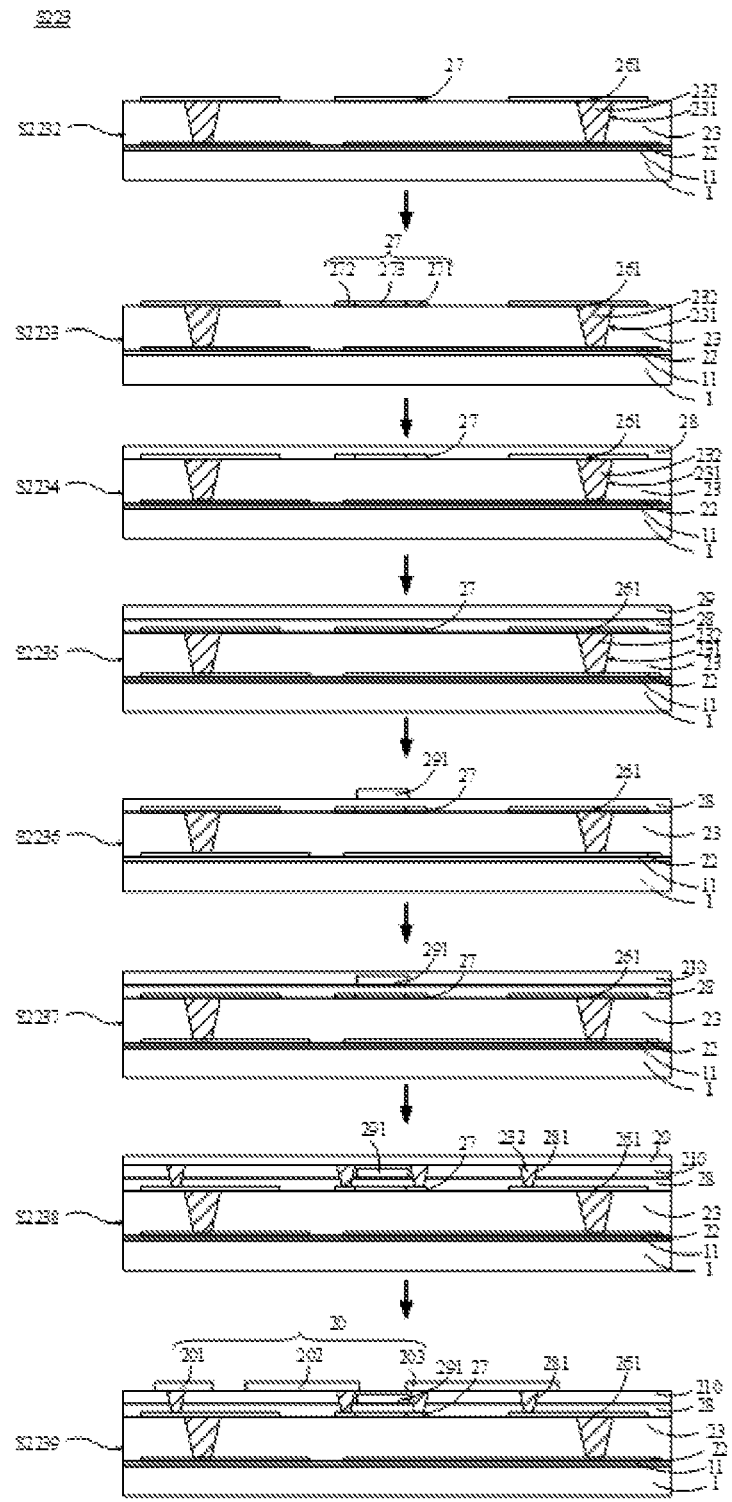
FIG. 18 is a further process flow diagram showing that setting an array circuit layer on the side of the substrate away from the binding layer in a fourth embodiment of the present disclosure.
Figure 19:
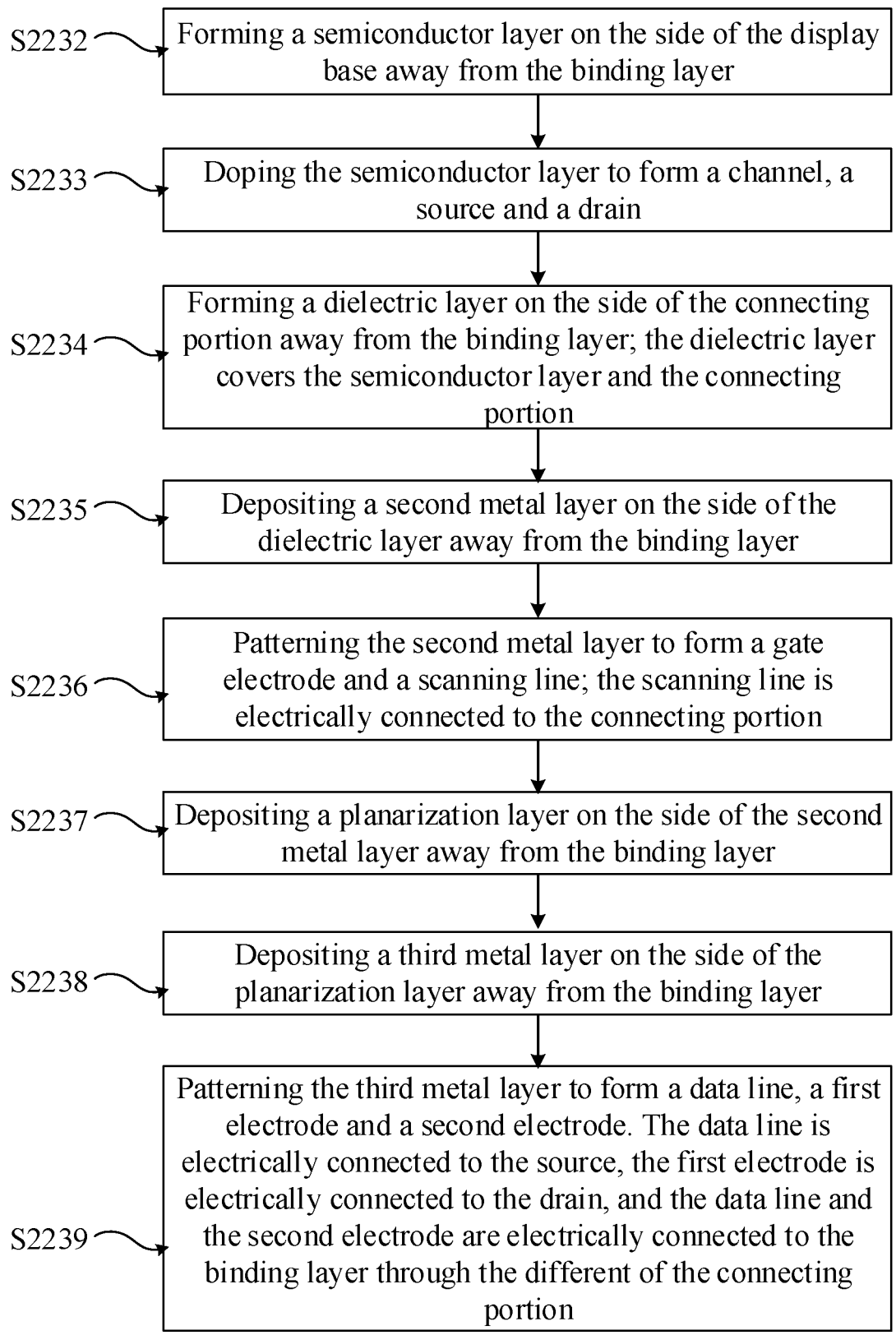
FIG. 19 is a further block flow diagram showing that setting an array circuit layer on the side of the substrate away from the binding layer in a fourth embodiment of the present disclosure.

Referring to FIG. 18 to FIG. 19, FIG. 18 is a further process flow diagram showing that setting an array circuit layer on the side of the substrate away from the binding layer in a fourth embodiment of the present disclosure. FIG. 19 is a further block flow diagram showing that setting an array circuit layer on the side of the substrate away from the binding layer in a fourth embodiment of the present disclosure.

Furthermore, the step S223 of arranging the array circuit layer 21 on the side of the display base 23 away from the binding layer 22 includes:

S2232: forming a semiconductor layer 27 on the side of the display base 23 away from the binding layer 22.

In one embodiment, the semiconductor layer 27 may be a semiconductor layer such as low-temperature polysilicon or indium oxide, which is not limited in present disclosure.

S2233: doping the semiconductor layer 27 to form a channel 273, a source 271 and a drain 272.

In one embodiment, both ends of the semiconductor layer 27 are doped to form the source 271 and the drain 272. In other embodiments, the semiconductor layer 27 may be prepared before the step of preparing the connecting portion 261. In the step of preparing the connecting portion 261, parts of the first metal layer 26 are deposited on both ends of the semiconductor layer 27 as the source 271 and the drain 272.

S2234: forming a dielectric layer 28 on the side of the connecting portion 261 away from the binding layer 22; the dielectric layer 28 covers the semiconductor layer 27 and the connecting portion 261.

In one embodiment, the dielectric layer 28 is configured to insulate, and the dielectric layer 28 needs to completely covers the semiconductor layer 27 and the connecting portion 261, so as to insulate the semiconductor layer 27, the connecting portion 261 and other metal layers, thus a short circuit is prevented. The dielectric layer 28 may also be a polymer such as PI.

S2235: depositing a second metal layer 29 on the side of the dielectric layer 28 away from the binding layer 22.

In one embodiment, the materials of the second metal layer 29 and the connecting portion 261 may be the same or different, and the connecting portion 261 and the semiconductor layer 27 is insulated from the second metal layer 29 by the dielectric layer 28 to prevent short circuit.

S2236: patterning the second metal layer 29 to form a gate electrode 291 and a scanning line (not shown in FIGURES); the scanning line is electrically connected to the connecting portion 261.

In one embodiment, the second metal layer 29 is patterned to form the gate electrode 291 and the scanning line. When a voltage is applied to the gate electrode 291, the source 271 and the drain 272 can be turned on to supply power to a light emitting unit 4 of the display panel 100. The gate electrode 291 is electrically connected to the scanning line, and at the same time, the scanning line is electrically connected to the other connection part 261, and the scanning line is connected to the binding layer 22 through the other connection part 261.

S2237: depositing a planarization layer 210 on the side of the second metal layer 29 away from the binding layer 22.

In one embodiment, the circuit of the second metal layer 29 is planarized by the planarization layer 210, so that other functional layers can be arranged on the second metal layer 29 conveniently, and the second metal layer 29 can also be insulated by the planarization layer 210. In addition, a second through hole 281 is formed in the planarization layer 210 and the dielectric layer 28, so that the connecting portion 261 can be partially exposed.

S2238: depositing a third metal layer 20 on the side of the planarization layer 210 away from the binding layer 22.

In one embodiment, the materials of the third metal layer 20, the second metal layer 29 and the first metal layer 26 may be the same or different, and the third metal layer 20 and the second metal layer 29 may be insulated by the planarization layer 210 to prevent short circuit. In addition, before the step of depositing the third metal layer 20, the conductive material 232 is filled in the second through hole 281 formed in the second metal layer 29 and the dielectric layer 28, and then the third metal layer 20 is deposited, and the third metal layer 20 is electrically connected to the connecting portion 261 through the conductive material 232 in the second through hole 281, and the third metal layer 20 is electrically connected to the binding layer 22 through the connecting portion 261.

S2239: patterning the third metal layer 20 to form a data line 203, a first electrode 202 and a second electrode 201. The data line 203 is electrically connected to the source 271, the first electrode 202 is electrically connected to the drain 272, and the data line 203 and the second electrode 201 are electrically connected to the binding layer 22 through the different of the connecting portion 261.

In one embodiment, after patterning the third metal layer 20, the data line 203, the first electrode 202 and the second electrode 201 are formed, the data line 203 is electrically connected to the source 271, one end of the first electrode 202 is electrically connected to the drain 272, and the other end of the first electrode 202 can be electrically connected to the anode of the light emitting unit 4 of the display panel 100. One end of the second electrode 201 is electrically connected to the connecting portion 261, and the other end of the second electrode 201 is electrically connected to the cathode of the light-emitting unit 4, and the first electrode 202 and the second electrode 201 provide power for the light-emitting unit 4. Also, the data line 203 and the second electrode 201 are both electrically connected to the binding layer 22, but the data line 203 and the second electrode 201 are electrically connected to the binding layer 22 through different connecting portion 261. The light-emitting unit 4 is disposed on the side of the array circuit board 21 away from the substrate 1, and the binding layer 22 is connected to the array circuit layer 21, so that the external control unit 3 and the light-emitting unit 4 are separated from each other and do not interfere with each other, thereby the light-emitting and control effects is improved.

Understandably, the data line 203 can be a Vdd line. Patterning the third metal layer 20 can also form other signal lines, such as V data lines, etc., and the circuit can be designed according to needs. The second electrode 201 is connected to a Vss line through the connecting portion 261.

Figure 20:
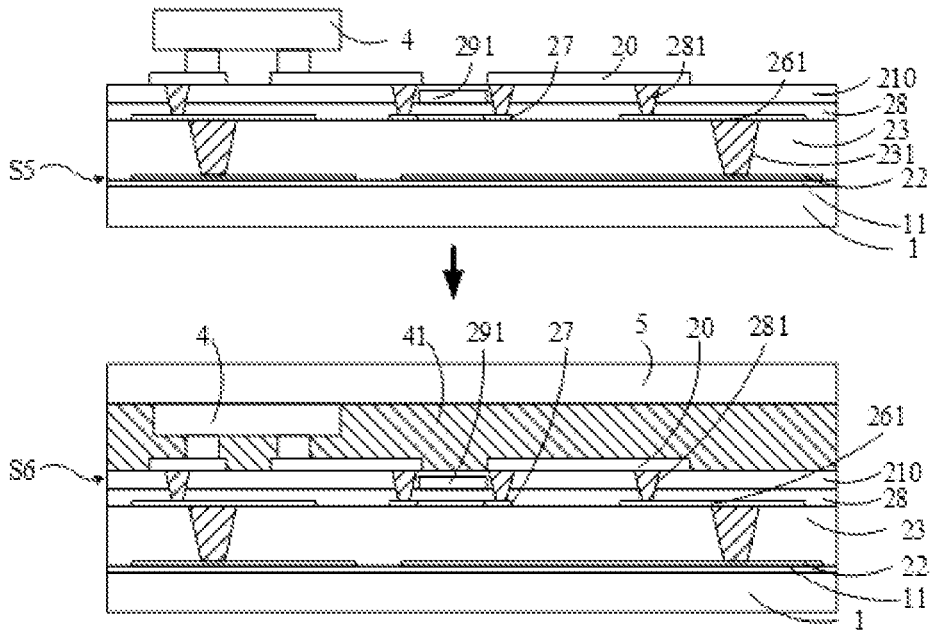
FIG. 20 is a further process flow diagram of the method for making the display panel provided in the first embodiment of the present disclosure.
Figure 21:
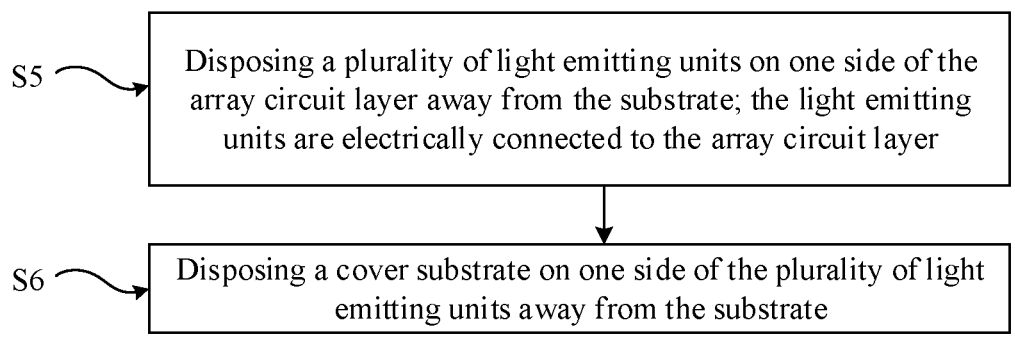
FIG. 21 is a further block flow diagram of the method for making the display panel provided in the first embodiment of the present disclosure.

Referring to FIG. 20 to FIG. 21, FIG. 20 is a further process flow diagram of the method for making the display panel provided in the first embodiment of the present disclosure. FIG. 21 is a further block flow diagram of the method for making the display panel provided in the first embodiment of the present disclosure.

In the first embodiment, the method for making the display panel 100 may further includes:

S5, disposing a plurality of light emitting units 4 on one side of the array circuit layer 21 away from the substrate 1; the light emitting units 4 are electrically connected to the array circuit layer 21.

In one embodiment, the light emitting unit 4 can be an LED, such as a Micro-LED or a Mini-LED. The light emitting unit 4 is transferred to the array circuit layer 21 by a massive transfer method. In one embodiment, the cathode of the light-emitting unit 4 is electrically connected to the second electrode 201 of the array circuit board, and the anode of the light-emitting unit 4 is electrically connected to the first electrode 202 of the array circuit board, so that the light-emitting unit 4 can provide light for the display panel 100 by the first electrode 202 and the second electrode 201.

S6, disposing a cover substrate 5 on one side of the plurality of light emitting units 4 away from the substrate 1.

In one embodiment, at first, an insulating material with viscosity is provided around the light emitting unit 4 and the surface away from the third metal layer 20 to form an insulating filling layer 41, and the cover substrate is covered on the insulating filling layer 41 to complete the packaging of the display panel 100. Other functional layers may be provided on one side of the cover substrate 5 away from the insulating filling layer 41, which is not limited in present disclosure.

Figure 22:
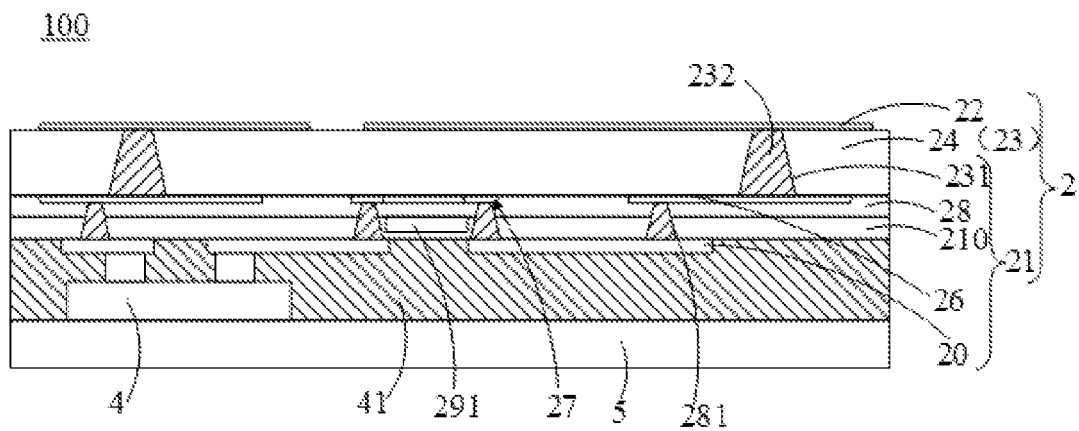
FIG. 22 is a structural schematic view of the cover substrate supporting the light emitting unit, the driving circuit layer, the insulating layer and the binding layer after the substrate is removed.

Referring to FIG. 22, FIG. 22 is a structural schematic view of the cover substrate supporting the light emitting unit, the driving circuit layer, the insulating layer and the binding layer after the substrate is removed.

Furthermore, the step S3 of removing the substrate 1 to expose the binding layer 22 includes:

keeping the plurality of the light emitting units 4, the driving circuit layer 2, the insulating layer 24 and the binding layer 22 being arranged on the cover substrate 5 in that order.

In one embodiment, after the substrate 1 and the sacrifice layer 11 are removed, the finally formed display panel 100 is obtained. As shown in FIG. 22, a plurality of light-emitting units 4, the driving circuit layer 2, the insulating layer 24 and the binding layer 22 are kept on the cover substrate 5, and the cover substrate 5 has support function and can support the light-emitting units 4, the driving circuit layer 2, the insulating layer 24 and the binding layer 22. It can be seen in the structure of the display panel 100 that not only the binding layer 22 is disposed on the back of the display panel 100, but also the external control unit 3 is bound on the binding layer 22 after the array circuit layer 21 is disposed, so that the array circuit layer is prevented from being damaged by a forming process of the hole or the setting process of the binding layer.

It could be understood that, since the cover substrate 5 has support function, that means the cover substrate 5 is free-standing, thus the cover substrate 5 can support the light-emitting units 4, the driving circuit layer 2, the insulating layer 24 and the binding layer 22. Therefore, in the embodiment, the insulating layer 24 can be a non-free-standing coating made by a thick film process. And, the thickness of the insulating layer 24 is less than the thickness of a transfer substrate in the prior art, thus the overall thickness of the display panel 100 is reduced compared with the prior art.

The cover substrate 5 is provided in the present disclosure and kept as a part of the display panel 100. The cover substrate 5 can support such as the light emitting unit 4, the driving circuit layer 2, the insulating layer 24 and the binding layer 22. Therefore, the insulating layer 24 of the present disclosure has a variety of options, such as a hard substrate, a flexible substrate, a insulating layer deposited by a thick film process. It can be seen that the arrangement of the cover substrate 5 and the insulating layer 24 of the present disclosure has a mutual cooperation relationship.

Figure 23:
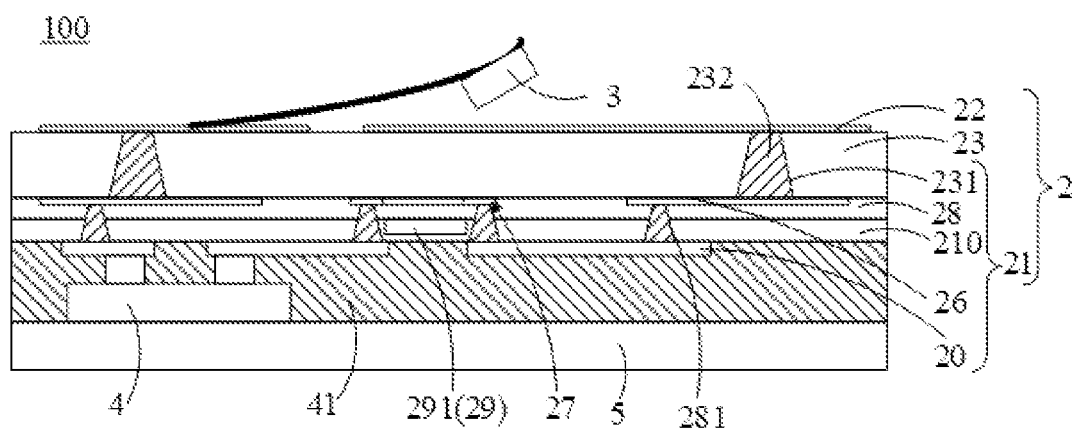
FIG. 23 is a structural schematic view in an embodiment of a display panel provided of the present disclosure.

Referring to FIG. 23, FIG. 23 is a structural schematic view in an embodiment of a display panel provided of the present disclosure.

In order to overcome the aforementioned technical problems, a display panel 100 is also provided by the present disclosure, and the display panel 100 is made by the aforementioned method.

In one embodiment, the display panel 100 includes a substrate 1 and a driving circuit layer 2. The driving circuit layer 2 includes a binding layer 22, a display base 23 and an array circuit layer 21. The display base 23 defines a plurality of first through holes 231, and a conductive material 232 is filled in the first through hole 231. The binding layer 22 covers the conductive material 232 and in direct contacts with the conductive material 232 to realize a electrical connection between the binding layer 22 and the connecting portion 261 formed by the first metal layer 26. The array circuit layer 21 includes a first metal layer 26, a dielectric layer 28, a second metal layer 29, a planarization layer 210 and a third metal layer 20 which are arranged in that order, and the second metal layer 29 is patterned to form a gate electrode 291. The specific structures and connection of the binding layer 22, the display base 23, the first metal layer 26, the dielectric layer 28, the second metal layer 29, the planarization layer 210 and the third metal layer 20 are the same as aforementioned, and will not be repeated here. The array circuit layer 21 is electrically connected to the light emitting unit 4, and the cover substrate 5 is disposed outside the light emitting unit 4 for packaging.

It should be noted that, compared with the preparation method in the background technology, in present disclosure, the display base 23 is deposited to form a hole, the conductive material 232 is filled in the hole, and then the binding layer 22 is covered, so that the binding layer 22 can be direct contacted with the conductive material 232, and the binding layer 22 can be electrically connected to the array circuit layer 21. Therefore, the opposite ends of the conductive material 232 in present disclosure are flushed with the opposite surfaces of the display base 23, and the binding layer 22 covers the hole and in direct contacts with the conductive material 232. In present disclosure, the in direct contact between the binding layer 22 and the conductive material 232 means that the binding layer 22 and the conductive material 232 are two independent components, and the binding layer 22 and the conductive material 232 are not integrally-formed. In addition, since the binding layer 22 and the conductive material 232 are prepared by different processes, different materials can be used.

The method for making the display panel disclosed in the present disclosure includes the following steps: providing a substrate; preparing a driving circuit layer on one side of the substrate; the driving circuit layer comprises a binding layer, a display base and an array circuit layer which are stacked, and the binding layer is located between the display base and the substrate. Removing the substrate and the binding layer is exposed; binding the external control unit on the binding layer. According to the present disclosure, the binding layer is set on the substrate, the display base and the array circuit layer are electrically connected to the binding layer, and the substrate is removed after the process of making the display panel, so that the binding layer can be exposed, thereby the array circuit layer is prevented from being damaged by a forming process of the hole or the setting process of the binding layer. In addition, a temporary substrate is not required to remove the substrate 1, so that the preparation process is simpler, time and manpower is saved, and the working efficiency is improved in the present disclosure.

The above shows only embodiments of the present disclosure, but does not limit the scope of the present disclosure. Any equivalent structure or equivalent process transformation made based on the specification and the accompanying drawings of the present disclosure, applied directly or indirectly in other related arts, shall be included in the scope of the present disclosure.

The invention claimed is:

1. A method for making a display panel, comprising:
   providing a substrate;
   preparing a driving circuit layer on one side of the substrate; wherein driving circuit layer preparing comprises a binding layer, a display base, and an array circuit layer which are stacked, and the binding layer is located on between the display base and the substrate; wherein the preparing a driving circuit layer on one side of the substrate comprises:
   forming the binding layer on the surface of the substrate; and
   depositing an insulating layer on the substrate; wherein the insulating layer is non-free-standing and deposited by a thick film process or by a coating process, the insulating layer is oxide insulating layer or nitride insulating layer, the thickness of the insulating layer is less than the thickness of a hard substrate or the thickness of a flexible layer, and the overall thickness of the display panel is reduced;
   forming a first through hole in the insulating layer;
   depositing a first metal layer on the surface of the insulating layer away from the substrate; wherein the first metal layer is partially arranged in the first through hole and electrically connected to the binding layer;
   patterning the first metal layer to form a connecting portion electrically connected to the binding layer;
   forming a semiconductor layer on the side of the insulating layer away from the binding layer;
   doping the semiconductor layer to form a channel, a source, and a drain;
   disposing a plurality of light emitting units on one side of the array circuit layer away from the substrate; wherein the light emitting units are electrically connected to the array circuit layer;
   disposing a cover substrate on one side of the plurality of light emitting units away from the substrate; wherein, the cover substrate is free-standing;
   removing the substrate to expose the binding layer, wherein removing the substrate to expose the binding layer comprises: keeping the plurality of the light emitting units, the driving circuit layer, the insulating layer and the binding layer being subsequently arranged on the cover substrate, wherein the plurality of the light emitting units, the driving circuit layer, the insulating layer and the binding layer are supported by the cover substrate;
   binding an external control unit on the binding layer.

2. The method for making the display panel of claim 1, further comprising:
   forming a sacrifice layer on the surface of the substrate before the preparing the driving circuit layer on one side of the substrate; and
   wherein the preparing the driving circuit layer on one side of the substrate comprises:
   preparing the driving circuit layer on the side of the sacrifice layer away from the substrate;
   wherein the removing the substrate comprises:
   separating the substrate from the driving circuit layer by removing the sacrifice layer.

3. The method for making the display panel of claim 1, wherein the arranging the array circuit layer on the side of the display base away from the binding layer further comprises:

forming a dielectric layer on the side of the connecting portion away from the binding layer; wherein the dielectric layer covers the semiconductor layer and the connecting portion;

depositing a second metal layer on the side of the dielectric layer away from the binding layer;

patterning the second metal layer to form a gate electrode and a scanning line; wherein the scanning line is electrically connected to the connecting portion;

depositing a planarization layer on the side of the second metal layer away from the binding layer;

depositing a third metal layer on the side of the planarization layer away from the binding layer;

patterning the third metal layer to form a data line, a first electrode and a second electrode; wherein the data line is electrically connected to the source, the first electrode is electrically connected to the drain, and the data line and the second electrode are electrically connected to the binding layer through different of the connecting portion.

4. The method for making the display panel of claim 1, wherein
the insulating layer is a hard substrate or a flexible layer.

5. The method for making the display panel of claim 1, wherein after forming the first through hole in the insulating layer comprises:
filling a conductive material in the first through hole.

6. The method for making the display panel of claim 3, wherein a plurality of second through hole are formed in the planarization layer and the dielectric layer, and the connecting portion is partially exposed by the second through holes.

7. The method for making the display panel of claim 6, wherein
a conductive material is filled in each of the second through holes, and the third metal layer is electrically connected to the connecting portion through the conductive material in each of the second through holes.

8. The method for making the display panel of claim 1, wherein
one end of the first electrode is electrically connected to the drain, and the other end of the first electrode is electrically connected to the anode of each of the light emitting units of the display panel;
one end of the second electrode is electrically connected to the connecting portion, and the other end of the second electrode is electrically connected to the cathode of the light emitting units; and
the first electrode and the second electrode both provide power for the light emitting units.

9. The method for making the display panel of claim 1, wherein
the binding layer is connected to the array circuit layer, and the external control unit and the light emitting units are separated from each other.

10. The method for making the display panel of claim 1, wherein
the light emitting units are transferred to the array circuit layer by a massive transfer method, and the light emitting units are a Micro-LED or a Mini-LED.

11. The method for making the display panel of claim 1, wherein
the cathode of the light emitting units are connected to the second electrode of the array circuit board, and the anode of the light emitting units is connected to the first electrode of the array circuit board.

12. The method for making the display panel of claim 1, wherein an insulating filling layer is provided around the light emitting units and the surface of the light emitting units away from the third metal layer, and the cover substrate is covered on the insulating filling layer.

13. A display panel, comprising:
a driving circuit layer, comprises a binding layer, a display base, and an array circuit layer which are stacked; wherein the driving circuit layer comprises:
an insulating layer, wherein the insulating layer is non-free-standing and deposited by a thick film process or by a coating process, the insulating layer is oxide insulating layer or nitride insulating layer, the thickness of the insulating layer is less than the thickness of a hard substrate or the thickness of a flexible layer, and the overall thickness of the display panel is reduced;
a first through hole, disposed in the insulating layer;
a first metal layer, disposed on the surface of the insulating layer; wherein the first metal layer is partially arranged in the first through hole and electrically connected to the binding layer; the first metal layer is patterned to a connecting portion electrically connected to the binding layer;
a semiconductor layer, disposed on the side of the insulating layer away from the binding layer; the semiconductor layer forms a channel, a source, and a drain;
a plurality of light emitting units, disposed on one side of the array circuit layer; wherein the light emitting units are electrically connected to the array circuit layer;
a cover substrate, disposed on one side of the plurality of light emitting units; wherein, the cover substrate is free-standing;
the plurality of the light emitting units, the driving circuit layer, the insulating layer and the binding layer are subsequently arranged on the cover substrate, wherein the plurality of the light emitting units, the driving circuit layer, the insulating layer and the binding layer are supported by the cover substrate.

14. The display panel of claim 13, wherein
the insulating layer is a hard substrate or a flexible layer.

15. The display panel of claim 13, further comprising:
a dielectric layer, formed on the side of the connecting portion away from the binding layer; wherein the dielectric layer covers the semiconductor layer and the connecting portion;
a second metal layer, disposed on the side of the dielectric layer away from the binding layer; wherein the second metal layer forms a gate electrode and a scanning line, and the scanning line is electrically connected to the connecting portion;
a planarization layer, disposed on the side of the second metal layer away from the binding layer;
a third metal layer, disposed on the side of the planarization layer away from the binding layer; wherein the third metal layer forms a data line, a first electrode and a second electrode; wherein the data line is electrically connected to the source, the first electrode is electrically connected to the drain, and the data line and the second electrode are electrically connected to the binding layer through different of the connecting portion.

16. The display panel of claim 15, wherein
a plurality of second through hole are formed in the planarization layer and the dielectric layer, and the connecting portion is partially exposed by the second through holes.

17. The display panel of claim 16, wherein
wherein a conductive material is filled in each of the second through holes, and the third metal layer is electrically connected to the connecting portion through the conductive material in each of the second through holes.

18. The display panel of claim 13, wherein
one end of the first electrode is electrically connected to the drain, and the other end of the first electrode is electrically connected to the anode of each of the light emitting units of the display panel;
one end of the second electrode is electrically connected to the connecting portion, and the other end of the second electrode is electrically connected to the cathode of the light emitting units; and
the first electrode and the second electrode both provide power for the light emitting units.

19. The display panel of claim 13, wherein
the binding layer is connected to the array circuit layer, and the external control unit and the light emitting units are separated from each other.

20. The display panel of claim 13, wherein
a conductive material is filled in the first through hole.

21. The display panel of claim 13, wherein
the cathode of the light emitting unit is connected to the second electrode of the array circuit board, and the anode of the light emitting unit is connected to the first electrode of the array circuit board.

22. The display panel of claim 13, further comprising:
an insulating filling layer, provided around the light emitting units and the surface of the light emitting units away from the third metal layer, and the cover substrate is covered on the insulating filling layer.

* * * * *